US010811386B2

(12) United States Patent
Chiu et al.

(10) Patent No.: US 10,811,386 B2
(45) Date of Patent: Oct. 20, 2020

(54) SEMICONDUCTOR DEVICE

(71) Applicant: SANDISK INFORMATION TECHNOLOGY (SHANGHAI) CO., LTD., Shanghai (CN)

(72) Inventors: Chin Tien Chiu, Taichung (TW); Hem Takiar, Fremont, CA (US); Gursharan Singh, Fremont, CA (US); Fisher Yu, Shanghai (CN); C C Liao, Changhua (TW)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/704,996

(22) Filed: Sep. 14, 2017

(65) Prior Publication Data
US 2018/0114777 A1  Apr. 26, 2018

(30) Foreign Application Priority Data

Oct. 26, 2016 (CN) .......................... 2016 1 0946885

(51) Int. Cl.
*H01L 25/065* (2006.01)
*H01L 23/00* (2006.01)
(Continued)

(52) U.S. Cl.
CPC ...... *H01L 25/0657* (2013.01); *H01L 23/3185* (2013.01); *H01L 24/24* (2013.01);
(Continued)

(58) Field of Classification Search
CPC .................................................. H01L 25/0657
See application file for complete search history.

(56) References Cited

U.S. PATENT DOCUMENTS

2002/0127775 A1* 9/2002 Haba ................... H01L 23/3128
                                                        438/109
2004/0207990 A1* 10/2004 Rose ...................... H05K 1/114
                                                        361/790
(Continued)

FOREIGN PATENT DOCUMENTS

CN       103403865       11/2013

OTHER PUBLICATIONS

English language Abstract for CN103403865 published Nov. 20, 2013.
(Continued)

*Primary Examiner* — Marcos D. Pizarro
*Assistant Examiner* — Quinton A Brasfield
(74) *Attorney, Agent, or Firm* — Vierra Magen Marcus LLC

(57) ABSTRACT

The present technology relates to a semiconductor device. The semiconductor device comprises: a plurality of dies stacked on top of each other, each of the dies comprising a first major surface, an IO conductive pattern on the first major surface and extended to a minor surface substantially perpendicular to the major surfaces to form at least one IO electrical contact on the minor surface, and the plurality of dies aligned so that the corresponding minor surfaces of all dies substantially coplanar with respect to each other to form a common flat sidewall, and a plurality of IO routing traces formed over the sidewall and at least partially spaced away from the sidewall. The plurality of IO routing traces are spaced apart from each other in a first direction on the sidewall, and each of IO routing traces is electrically connected to a respective IO electrical contact and extended across the sidewall in a second direction substantially perpendicular to the first direction on the sidewall.

13 Claims, 20 Drawing Sheets

(51) Int. Cl.
*H01L 25/00* (2006.01)
*H01L 23/31* (2006.01)
(52) U.S. Cl.
CPC .............. *H01L 24/82* (2013.01); *H01L 25/50* (2013.01); *H01L 2224/24145* (2013.01); *H01L 2224/32145* (2013.01); *H01L 2224/94* (2013.01); *H01L 2225/06524* (2013.01); *H01L 2225/06551* (2013.01); *H01L 2225/06562* (2013.01); *H01L 2225/06565* (2013.01); *H01L 2924/37001* (2013.01)

(56) References Cited

U.S. PATENT DOCUMENTS

| | | | | |
|---|---|---|---|---|
| 2005/0029645 | A1* | 2/2005 | Mess | H01L 25/0657 257/686 |
| 2009/0068790 | A1* | 3/2009 | Caskey | H01L 24/97 438/109 |
| 2009/0321950 | A1* | 12/2009 | Takiar | H01L 24/83 257/777 |
| 2011/0037159 | A1* | 2/2011 | McElrea | H01L 24/82 257/686 |
| 2011/0169171 | A1* | 7/2011 | Marcoux | H01L 23/481 257/774 |
| 2012/0025364 | A1* | 2/2012 | Hoshino | H01L 25/0657 257/686 |
| 2012/0211878 | A1 | 8/2012 | Popovic et al. | |
| 2014/0213020 | A1* | 7/2014 | Crane | H01L 24/24 438/118 |

OTHER PUBLICATIONS

Office Action dated Nov. 16, 2018 in Korean Patent Application No. 10-2017-0113210.
Response to Office Action filed Jan. 8, 2019 in Koren Patent Application No. 10-2017-0113210.

* cited by examiner

SEMICONDUCTOR DEVICE

BACKGROUND OF THE INVENTION

Field

The present technology relates to semiconductor devices.

Description of Related Art

The strong growth in demand for portable consumer electronics is driving the need for high-capacity storage devices. The semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While various packaging configurations are known, flash memory storage cards may in general be fabricated as system-in-a-package (SiP) or multichip modules (MCM), where a plurality of dies are mounted and interconnected on a substrate. The substrate includes a rigid, dielectric base having a conductive layer applied and patterned on one or both sides. Electrical connections such as wire bonds or through silicon vias (TSVs) are formed between conductive pads on the die and the conductive layer(s) on the substrate for interconnection between dies as well as between dies and the substrate. Once electrical connections are made, the assembly is then typically encased in a molding compound providing protection from the environment.

In order to improve IO speed and IO reliability of a semiconductor device, the electrical connections for data input and output (IO) are grouped into multiple IO channels so as to distribute IO throughputs among those IO channels. The multiplication of the IO channels typically demands significantly more electrical connections. For example, a DDR High-Bandwidth Memory (HBM) device including four stacked dies configured with TSV electrical connection requires more than one thousands IO pins to implement sixteen IO channels. Such significant increase of IO pins may complicate circuit designs of respective semiconductor device and cause difficulty to implement the semiconductor device with multiple IO channels.

DETAILED DESCRIPTION

Embodiments will now be described with reference to FIGS. 1A through 16B, which relate to a semiconductor device and a fabricating method of a semiconductor device. It is understood that the present technology may be embodied in many different forms and should not be construed as being limited to the embodiments set forth herein. Rather, these embodiments are provided so that this disclosure will be thorough and complete and will fully convey the present technology to those skilled in the art. Indeed, the present technology is intended to cover alternatives, modifications and equivalents of these embodiments, which are included within the scope and spirit of the invention as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "left", "right", "top," "bottom," "upper," "lower," "vertical" and/or "lateral" as may be used herein are for convenience and illustrative purposes only, and are not meant to limit the description of the present technology inasmuch as the referenced item can be exchanged in position. Also, as used herein, the articles "a" and "an" are intended to include both single and plurality forms, unless the content clearly indicates otherwise. The terms "substantially" and/or "about" mean that the specified dimension or parameter may be varied within an acceptable manufacturing tolerance for a given application. In one embodiment, the acceptable manufacturing tolerance is ±0.25%.

Throughout the figures, same or similar components are labeled in the same fashion with the same last two digits.

Figure 1A:
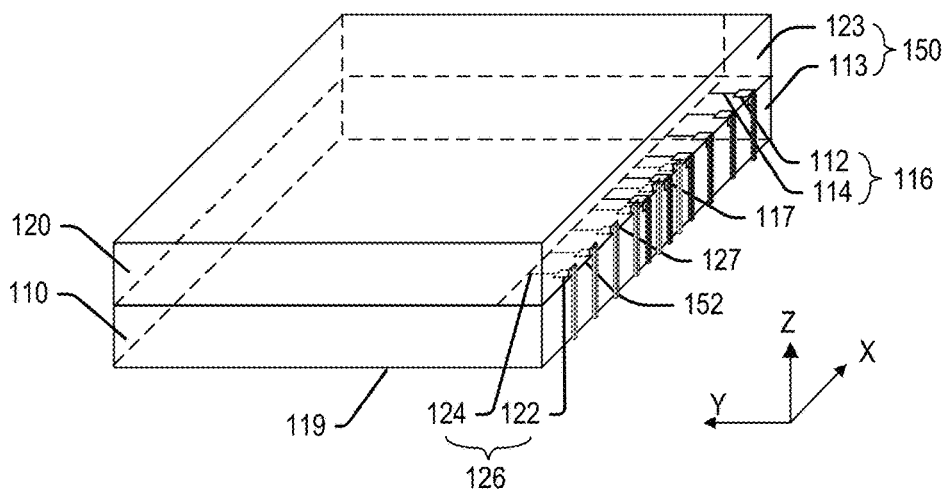
FIG. 1A to 1C are a schematic perspective view, a schematic front view and a schematic sectional view taken along line C-C' in FIG. 1B of a semiconductor device according to an embodiment of the present technology, respectively.
Figure 1B:
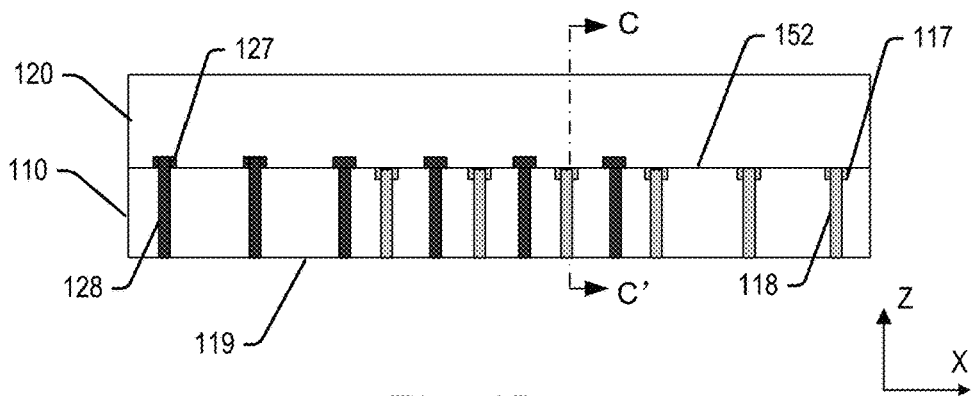
Figure 1C:
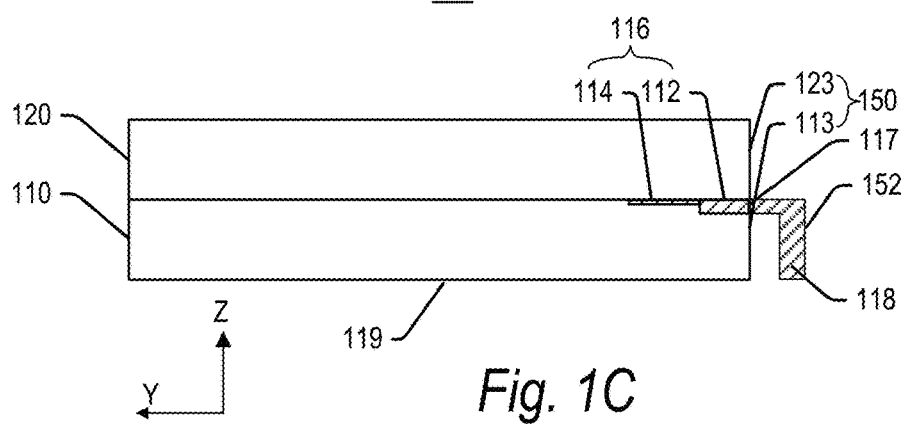

An embodiment of the present technology will now be described with reference to FIG. 1A to FIG. 1C, a schematic perspective view, a schematic front view and a schematic sectional view taken along line C-C' in FIG. 1B of a semiconductor device 100. Referring to FIG. 1A to FIG. 1C, the semiconductor device 100 includes a die stack having a pair of dies of a first die 110 and a second die 120. The first die 110 and second die 130 can include memory die such as flash memory die.

The first die 110 includes an input and output (IO) conductive pattern 116 on an active surface of the first die 110. The active surface of a die is a first major surface, one of major surfaces of die where electronic elements and circuitry are formed. The IO conductive pattern is an electrical circuitry for transferring IO signals to and from the die. The IO conductive pattern 116 is extended to a side surface 113 of the first die 110 to have an edge exposed on the side surface 113 to form first IO electrical contacts 117 (only one of them is labeled). The side surface of the die is a minor surface of the die substantially perpendicular to the major surfaces of the die. For example, the IO conductive pattern 116 can include at least one IO pad 112 (only one of them is labeled) arranged along an edge of a side surface 113, and at least one an inlet trace 114 (only one of them is labeled, partially shown in FIG. 1A and FIG. 1C) extending from the IO pad 112 towards inner region of the die 110 on the active surface. The IO bonding pads 112 are exposed on the sidewall 113 to form first IO electrical contacts 117. The rest of the IO conductive pattern 116 is not shown for the sake of the clarity of illustration. Alternatively, the IO conductive pattern can also include IO pads arranged spaced from the edge and outlet traces extending from IO pads to the edge, which will be shown in further embodiments.

Similarly, the second die 120 can have a substantially same conductive pattern configuration on the active surface as that of the first die 110. For example, the second die 120 includes an IO conductive pattern 126 on an active surface of the second die 120. The IO conductive pattern 126 includes at least one IO pad 122 (only one of them is labeled) arranged along an edge of a side surface 123, and an inlet trace 124 (only one of them is labeled) extending from the IO pad 122 towards inner region of the die 120. The rest of the IO conductive pattern 126 is not shown for the sake of the clarity of illustration. The IO pads 122 are exposed on the side surface 123 to form second IO electrical contact 127*s* (only one of them is labeled).

In the semiconductor device 100, the first die 110 and the second die 120 are stacked vertically on top of each other with their active surfaces facing each other. The first die 110 and the second die 120 are affixed to each other by an insulating adhesive layer such as a DAF (die attach film) layer (not shown). The first die 110 and the second die 120 are aligned so that the side surface 113 of the first die 110 and the side surface 123 of the second die 120 are substantially coplanar with respect to each other to form a common flat sidewall 150 and share a common edge 152 extending in a first direction ion the sidewall 1500 for example X direction shown in FIG. 1B.

As shown in FIG. 1B, the arrangement of the first IO electrical contacts 117 of the first die 110 on the side surface 113 and the arrangement of the second IO electrical contacts 127 of the second die 120 on the side surface 123 can be substantially the same. For example, the first and second IO electrical contacts 117 and 127 can have a same asymmetric arrangement relative to the respective center line of the respective side surface. In this case, the IO electrical contacts 117 and 127 can be readily spaced apart along the shared edge 152 in the first direction on the sidewall 150 when the active surfaces of the first die 110 and the second die 120 face each other. For example, both the first and second IO electrical contacts 117 and 127 are arranged with a uniform spacing and distributed partially along a first direction on the sidewall 150.

The semiconductor device 100 further includes first IO routing traces 118 and second IO routing traces 128 extending in a second direction substantially perpendicular to the first direction on the sidewall 150 (for example Z direction shown in FIG. 1B) across the sidewall 150. The routing traces 118 and 128 can be extended to a terminal surface 119 of die stack. The terminal surface of a die stack is either the top major surface of the topmost die or the bottom major surface of the bottommost die in the die stack. The terminal surface 119 herein refers to a second major surface opposite to the first major surface of the bottommost die of the die stack, and attached onto either a substrate or a host device (not shown). IO routing traces are designated traces for transferring IO signals to and from the dies. The first IO routing traces 118 and second IO routing traces 128 electrically couple the first IO electrical contacts 117 of the first die 110 and second IO electrical contacts 127 of the second die 120 to the substrate or host device, respectively. In this case, the first electrical contacts 114 and the first IO routing traces 118 form a first IO channel, whereas the second electrical contacts 124 and the second IO routing traces 128 form a second IO channel separated from the first IO channel. IO routing traces are not limited to straight line shape shown in FIG. 1A to FIG. 1C and can include other shapes such as bending lines in further embodiments.

The IO routing traces 118 and 128 are at least partially spaced from the sidewall 150. The traces 118 can be formed on an insulating layer applied on the sidewall 150 and electrically connected to the respective electrical contact 114 via the opening(s) filled with the same conductive material as the trace 118. Alternatively, the trace 118 can also be formed as a bridge conductive pattern without the insulating layer underneath, as shown in FIG. 1C. The IO routing traces 118 and 128 formed on the sidewall of the die stack of the semiconductor device can be referred as "The Sidewall" (TSW) structure.

The traces can be configured with a shape including a straight line, bending lines or curve. The conductive patterns 116, 126 and IO routing traces 118 and 128 can be made of conductive materials such as copper, gold, aluminum, tungsten, nickel or alloys thereof. The number of IO electrical contacts 117 and 127, and the number of traces 118 and 128 may vary in further embodiments.

The semiconductor device 100 may further include a substrate for supporting and electrically connecting to the die stack and/or a molding compound encapsulating the die stack and routing traces formed on the sidewall of the die stack.

According to the present embodiment, multiple IO channels can be formed in the semiconductor device by extending the IO conductive patterns on the active surfaces of the respective dies to the common sidewall of the die stack and forming IO routing traces over the sidewall in a TSW structure. Thus multiple IO channels can be distributed on the sidewall of die stack in the semiconductor device. In comparison with the conventional semiconductor devices having multiple IO channels implemented with either the conventional wire bond or TSV structure, the semiconductor device with the TSW structure according to the present embodiment can utilize the sidewall of the dies to distribute IO channels, thus improving design flexibility of IO circuitry in the semiconductor device. In addition, there is no wire bond structure in the semiconductor device according to the present embodiment, thus the throughput and yield of the semiconductor device might be improved due to omission of wire bonding process. In addition, since routing traces in the IO channels are exposed on the sidewall of the die stack, it is easy for visual inspection of IO channels, enabling simple and reliable quality control of the product, which in turn improves yield and lowers cost for the semiconductor device.

In addition, in the present embodiment, multiple IO channels are obtained in a semiconductor device having dies with a single type of configuration for the IO conductive pattern by placing the first die 110 and the second die 120 in the same pair face to face. In this case, the dies in the semiconductor device can be singularized from a single wafer or wafers containing a single type of dies. This could improve yield and save production cost. Furthermore, the dies in the semiconductor device are stacked vertically, thus minimizing footprint of the die stack on either the substrate or host device.

A fabricating method of a semiconductor device according to an embodiment of the present technology will now be explained by referring to a flow chart of FIG. 2 and schematic views of FIG. 3A to FIG. 3C.

Figure 2:
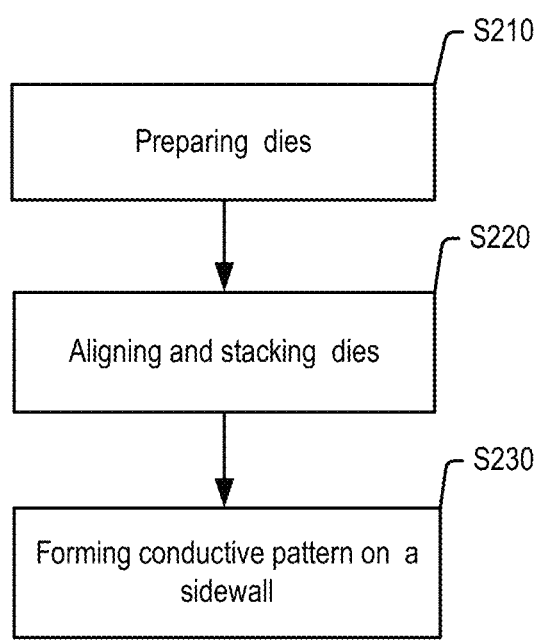
FIG. 2 is a flow chart showing a fabricating method of a semiconductor device according to an embodiment of the present technology.
Figure 3A:
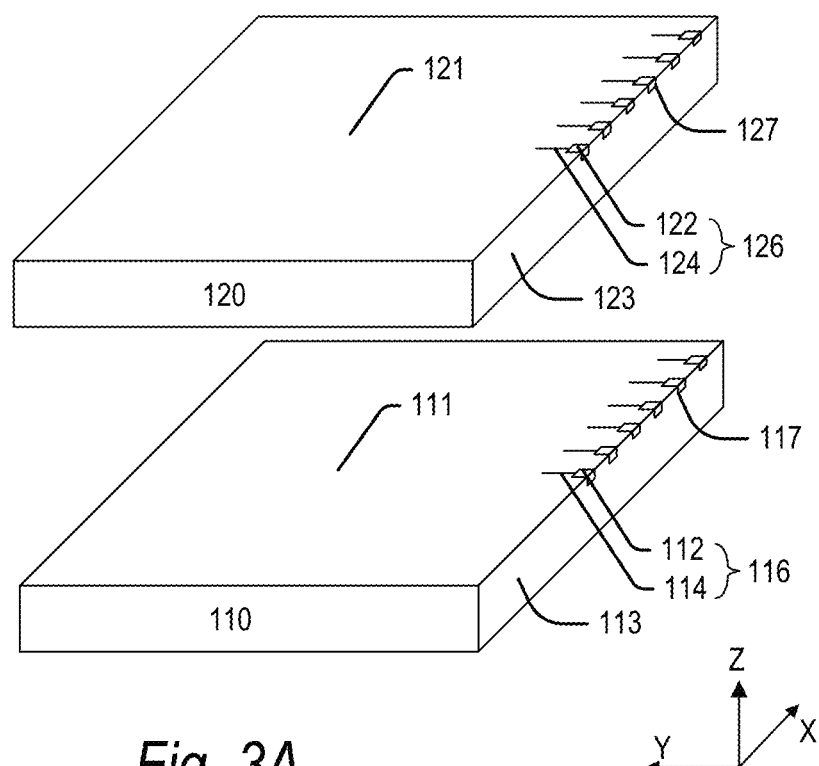
FIG. 3A to FIG. 3C are schematic perspective views showing different steps of the fabricating method of the semiconductor device according to the embodiment of the present technology.
Figure 3B:
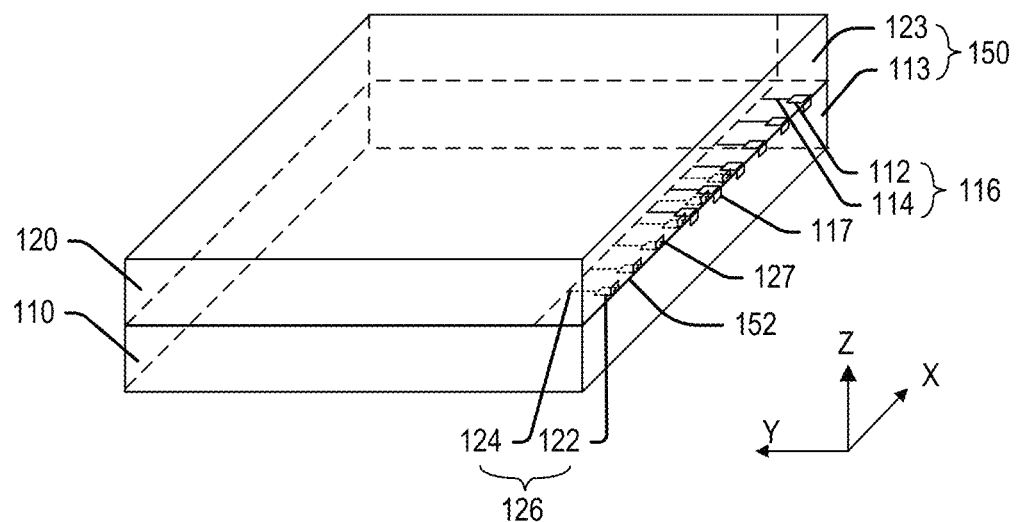

As shown in FIG. 2, the method starts at a step of S210 of preparing dies, for example a first die 110 and a second die 120 as shown in FIG. 3A. The first die 110 and the second die 120 can be singularized from a same wafer or different wafers. The first die 110 and the second die 120 can have a same configuration such as the same size and same design for IO conductive patterns 116 and 126 formed on the active surfaces of the respective dies. The first die 110 and second die 120 have first IO conductive pattern 116 and second IO conductive pattern 126 formed on respective active surfaces. The IO conductive patterns 116 and 126 are exposed on the side surfaces 113 and 123 of the first and second dies 110 and 120 to form IO electrical contacts 117 and 127, respectively. Other details of the first die 110 and the second die 120 are substantially the same as those described in previous embodiment, thus will not be repeated herein.

Next, at a step S220, the dies 110 and 120 are stacked and affixed on top of each other via an insulating adhesive layer such as DAF layer (not shown) to form a die stack. The dies 110 and 120 are aligned so that the side surface 113 of the first die 110 and the side surface 123 of the second die 120 are substantially coplanar with respect to each other to form a common sidewall 150 and share a common edge 152, as shown in FIG. 3B. The active surfaces of the first die 110 and the second die 120 face each other in the stack so that IO electrical contacts 117 and 127 are spaced from each other along the first direction on the sidewall 150.

Figure 3C:
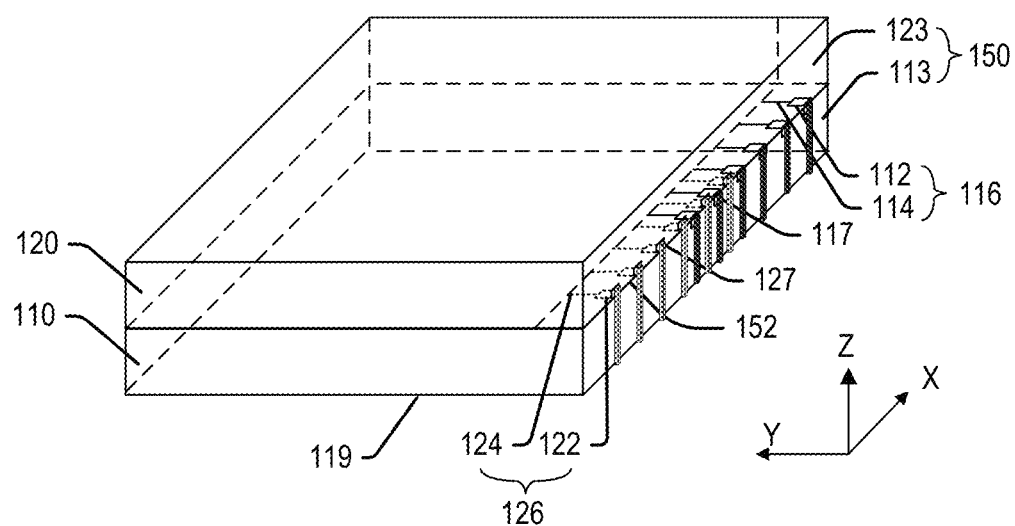

Next, at a step 230, routing traces 118 and 128 are formed over the sidewall 150 in a TSW structure and extended from the respective IO electrical contacts 117 and 127 respectively to a terminal surface 119 of the die stack, as shown in FIG. 3C. The traces 118 and 128 are electrically connected to the respective IO electrical contacts 317 and 327 of the first die 310 and second die 320, and extended across the sidewall 150, and can be further connected to a substrate or a host device (not shown) disposed on the terminal surface 119. In this way, multiple IO channels from the dies to the substrate or host device can be formed on the sidewall 150 of the die stack. The IO routing traces 118 and 128 can be made of a conductive material such as gold, copper, gold plated copper or the like. The method of forming IO routing traces over the sidewall of a die stack will be described later in more detail in the specification.

Figure 4A:
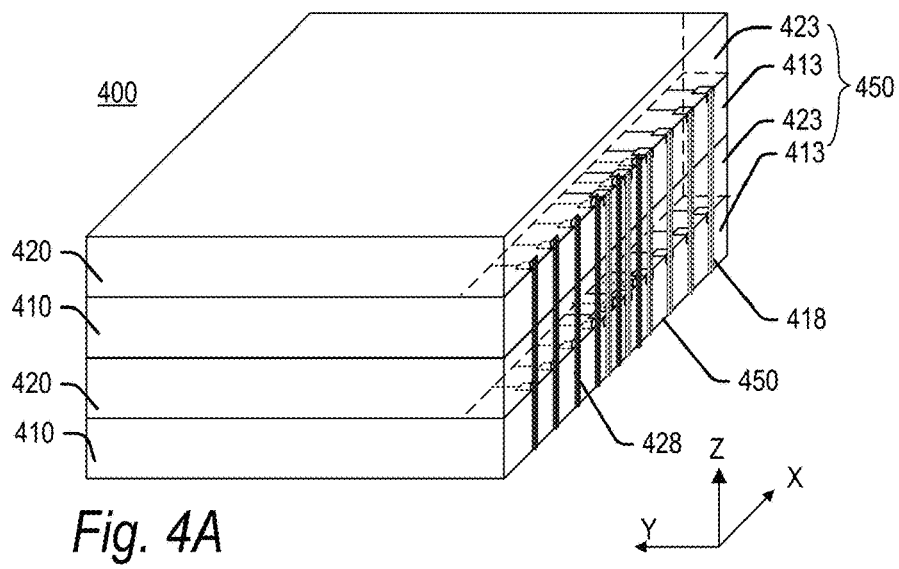
FIG. 4A to FIG. 4C are a schematic perspective view, a schematic front view and a schematic sectional view taken along line C-C' in FIG. 4B of a semiconductor device according to a further embodiment of the present technology.
Figure 4B:
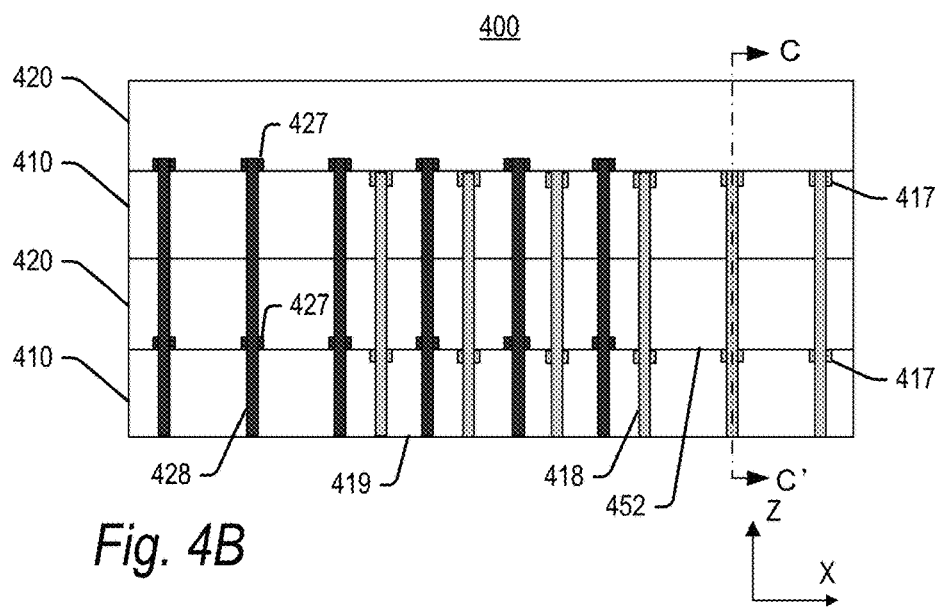
Figure 4C:
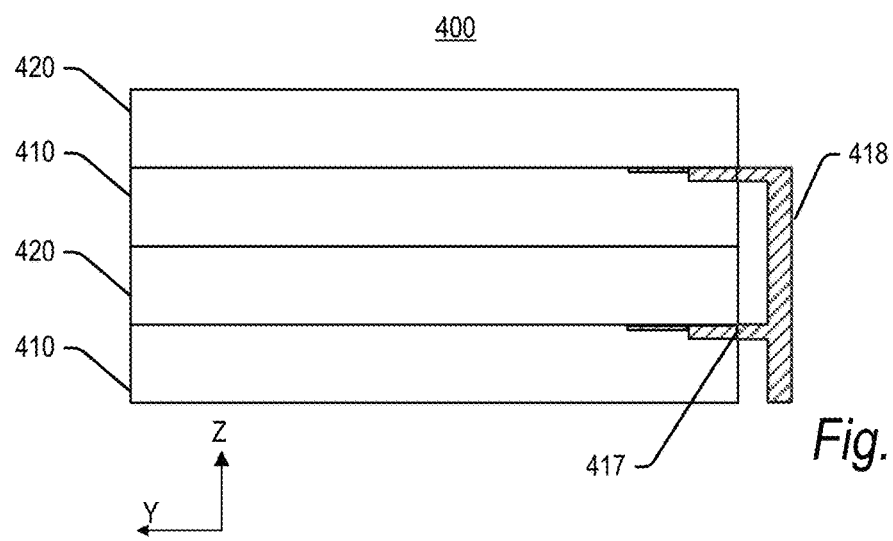

The semiconductor device according to the present technology can include multiple pairs of dies. The number of dies in a die stack may vary in further embodiments, including for example 2, 4, 8, 16, 32 dies or other numbers of dies in the stack in further embodiments. FIG. 4A to FIG. 4C are a schematic perspective view, a schematic front view, and a schematic sectional view taken along line C-C' in FIG. 4B of a semiconductor device 400 according to a further embodiment of the present technology. The semiconductor device 400 includes four dies, that is, two pairs of dies stacked vertically on top of each other. Each pair of dies includes a first die 410 and a second die 420 with their active surfaces facing each other. The details of the first die 410 and a second die 420 are substantially the same as those of the first die 110 and second die 120 in the previous embodiments, thus will not be repeated herein. In the present embodiment, the first IO electrical contacts 417 of the two first dies 410 arranged along a first direction (for example X direction of FIG. 4A to FIG. 4C) and exposed on the sidewall 450 are electrically connected by respective first IO routing traces 418 extending across the sidewall 450 in a second direction substantially perpendicular to the first direction on the sidewall 450 (for example Z direction of FIG. 3A to FIG. 3C) of the die stack to a terminal surface 419 of the die stack so as to form a first IO channel, and the second IO electrical contacts 424 of the two second dies 420 are connected by second IO routing traces 428 extending in a thickness direction to a terminal surface 419 of the die stack so as to form a second IO channel. In this case, the semiconductor device 400 includes four dies with two IO channels. The present embodiment can include more pairs of dies connected to the first IO channel and second IO channel.

Figure 5A:
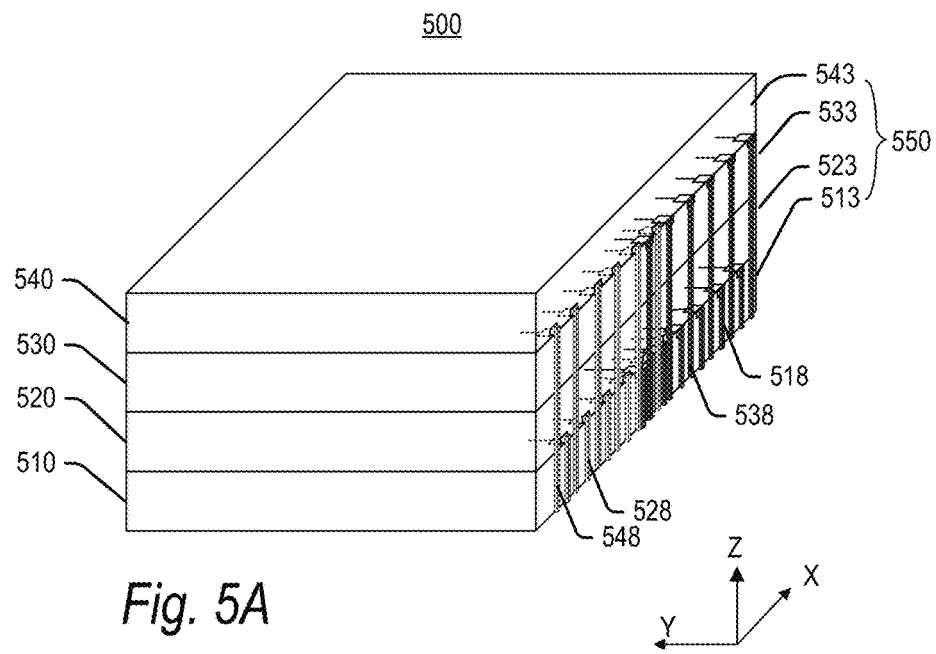
FIG. 5A and FIG. 5B are a schematic perspective view and a schematic front view of a semiconductor device according to a further embodiment of the present technology.
Figure 5B:
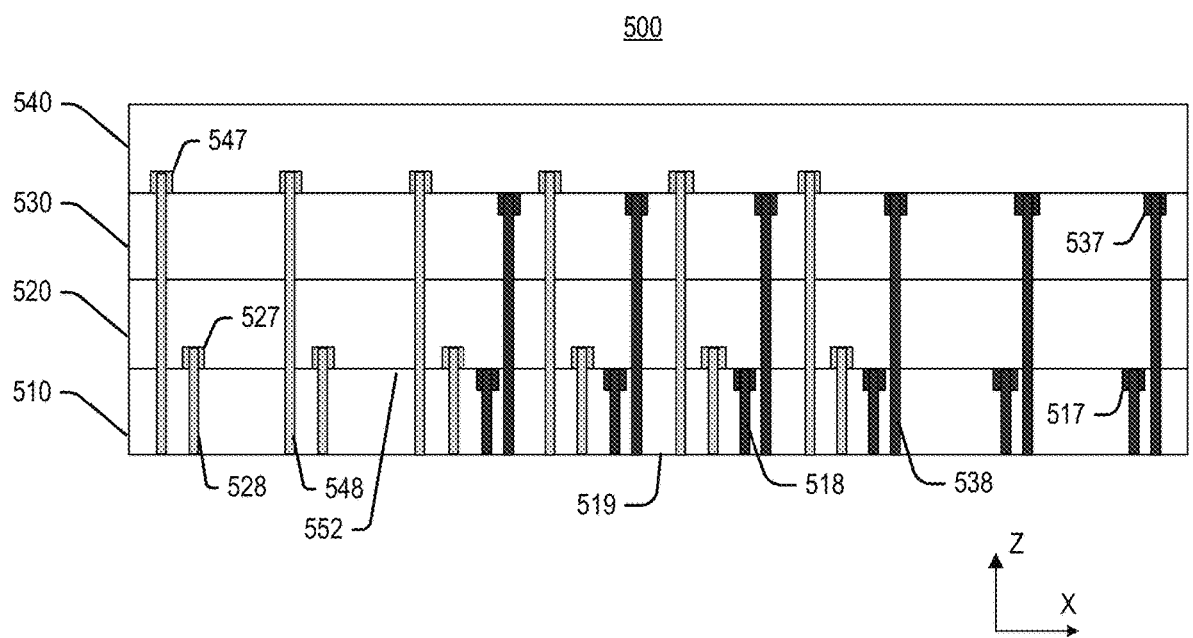

The present technology is not limited to two IO channels in previous embodiments and can include more IO channels. FIG. 5A and FIG. 5B are a schematic perspective view and a schematic front view of a semiconductor device 500 according to a further embodiment of the present technology. The semiconductor device 500 includes four semiconductor dies, that is, dies 510, 520, 530 and 540 vertically stacked and affixed on top of each other sequentially. The dies 510, 520, 530 and 540 are aligned to form a flat common sidewall 550. The dies 510 to 540 include IO electrical contacts 517 to 547 arranged along a first direction (for example X direction in FIGS. 5A and 5B) and exposed on the sidewall 550 and routing traces 518 to 548 extending across the sidewall 550 in a second direction substantially perpendicular to the first direction (for example Z direction in FIGS. 5A and 5B) on the sidewall 550 to a terminal surface 519 of the die stack. IO electrical contacts 517 to 547 and routing traces 518 to 548 are electrically connected respectively to form four IO channels. In other words, the IO electrical contacts of each of dies in the die stack are connected to an independent IO channel. In other words, the IO electrical contacts of the same die are connected to the same IO channel, and the IO electrical contacts of different dies are connected to different IO channels. In the present embodiment, more IO channels can be formed in the semiconductor device 500 in comparison with the semiconductor device 400. Other aspects of the semiconductor device 500 in present embodiment are substantially same as those of the semiconductor device 400, and will not be repeated herein.

Figure 6A:
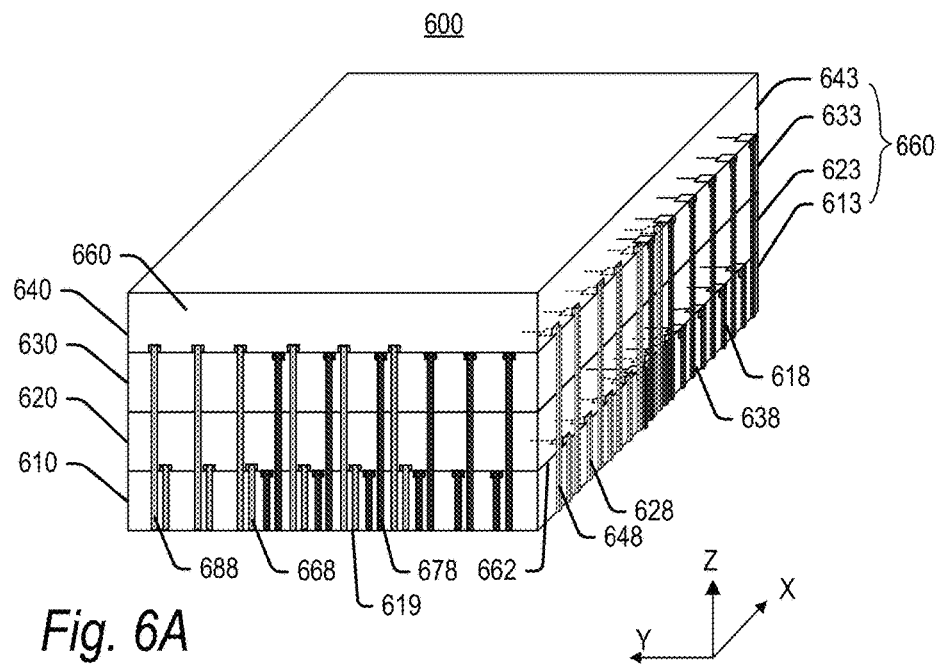
FIG. 6A and FIG. 6B are a schematic perspective view and a schematic front view of a semiconductor device according to a further embodiment of the present technology.
Figure 6B:
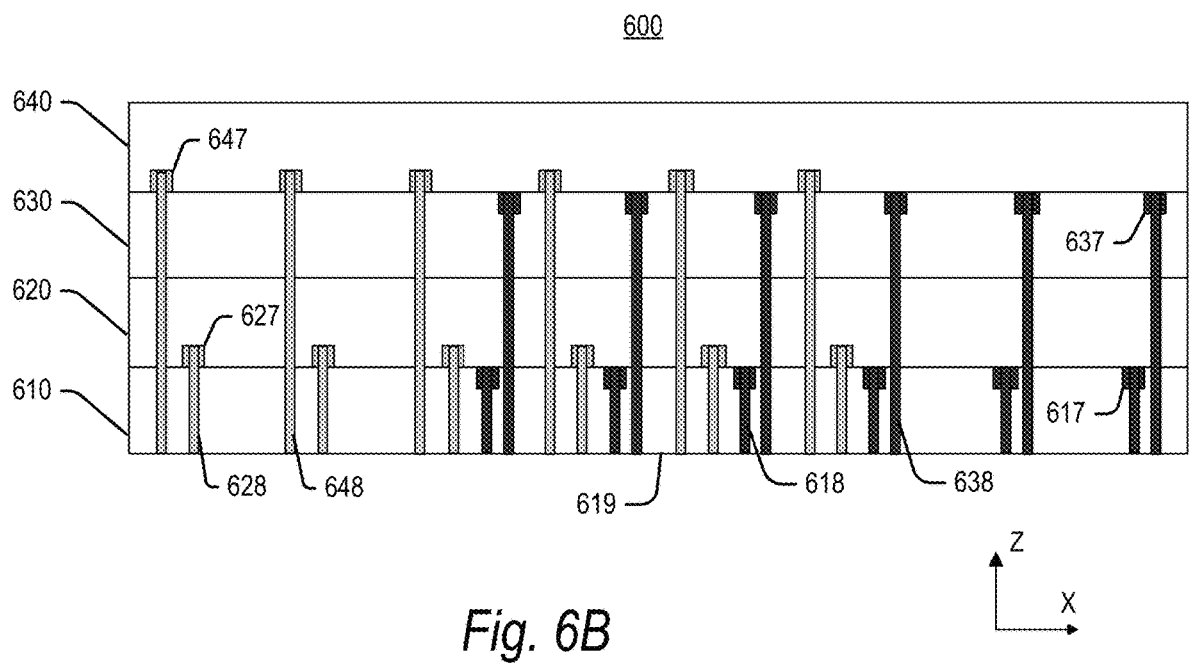
Figure 7A:
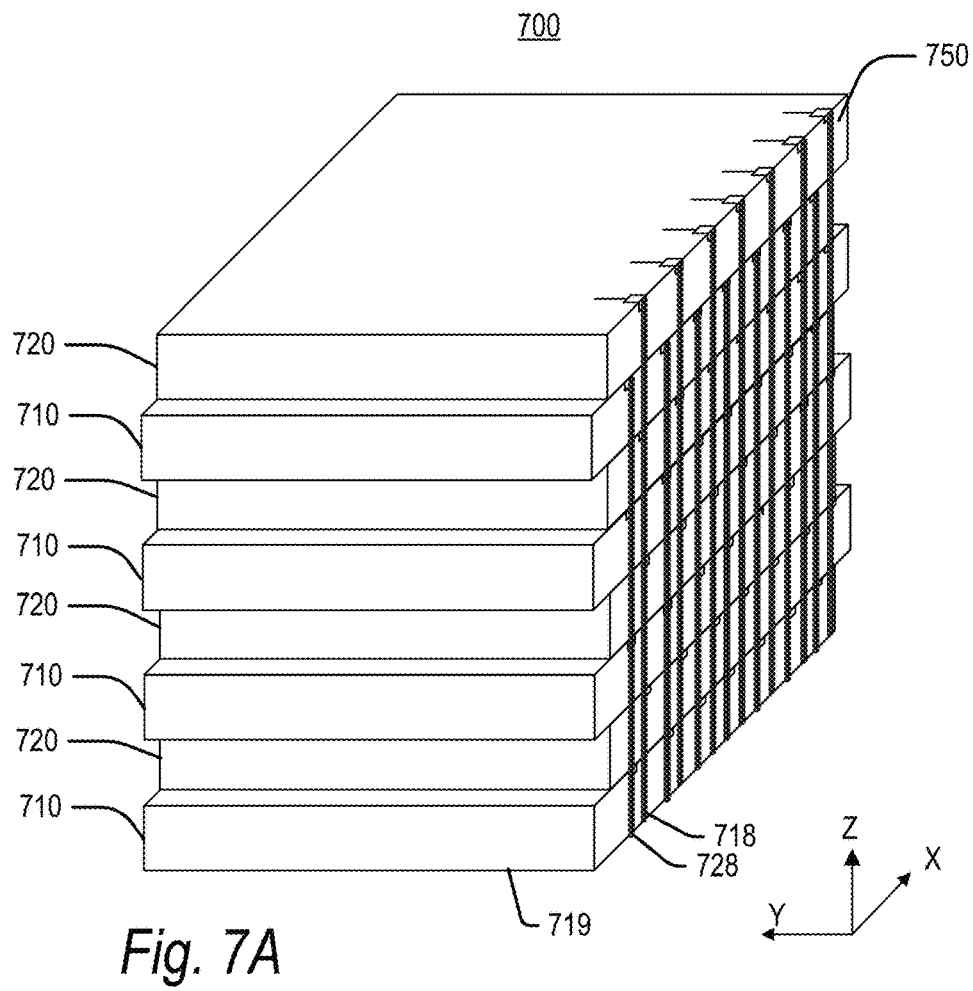
FIG. 7A and FIG. 7B are a schematic perspective view and a schematic front view of a semiconductor device according to a further embodiment of the present technology.
Figure 7B:
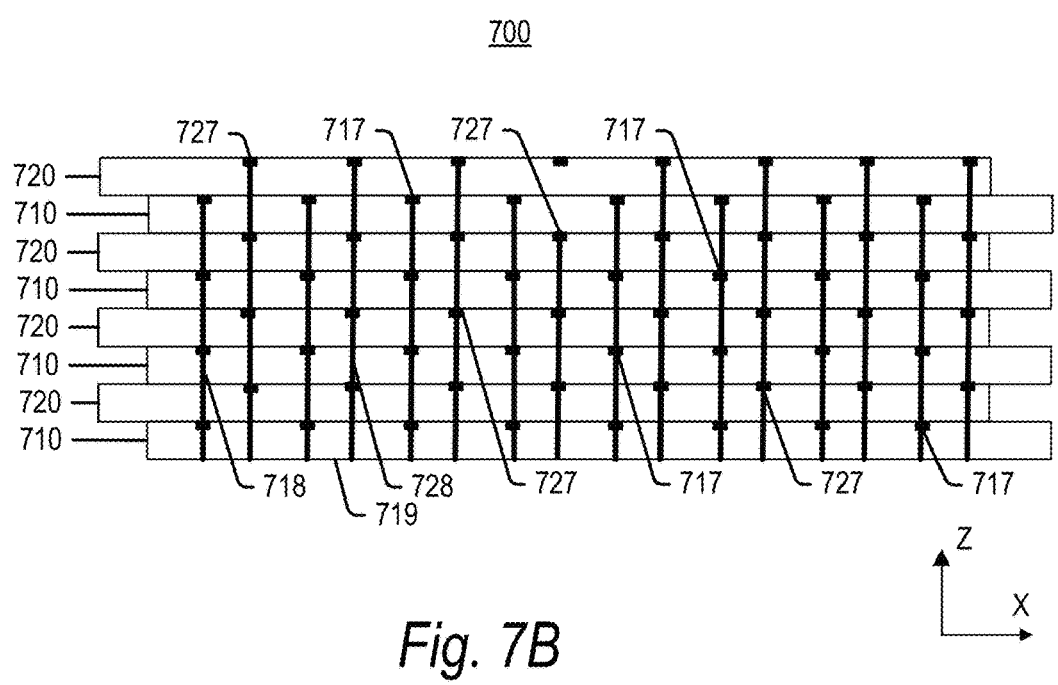

In the embodiments described above, the IO channels are distributed in a single sidewall. The present technology is not limited thereto and IO channels can be formed on multiple sidewalls to further increase the number of IO channels. FIG. 6A and FIG. 6B are a schematic perspective view and a schematic front view of the semiconductor device according to a further embodiment of the present technology. In the present embodiment, the semiconductor device 600 includes four dies 610, 620, 630 and 640 stacked and affixed on top of each other. The four dies 610, 620, 630 and 640 are aligned to form at least two common sidewalls 650 and 660. In this case, at least eight IO traces 618 to 688 can be distributed on the two sidewalls 650 and 660 and extended to a terminal surface 619 of the die stack. The semiconductor device according to the present technology can have even more IO channels formed on more common sidewalls. For example, a semiconductor device according to the present technology can include a die stack of four dies including sixteen IO channels evenly distributed on four common sidewalls of the die stack. Other details of the semiconductor device 600 are substantially the same as those described in previous embodiments, thus will not be repeated herein.

In the semiconductor devices according to previous embodiments of the present technology, the dies are stacked vertically with the active surfaces of the dies in the same die pair in the stack face each other. The present technology is not limited thereto. As shown in a schematic perspective view of FIG. 7A and a schematic front view of FIG. 7B, a semiconductor device 700 according to a further embodiment includes four pairs of dies stacked and aligned to form a common flat sidewall 750 on a X-Z plane of the semiconductor device 700. Each pair of dies includes a first die 710 and a second die 720. The first die 710 and second die 720 can have the same configuration such as same dimension and same IO circuitry designs on the active surface. All dies 710 and 720 in the stack have their active surfaces facing the same direction for example Z direction shown in FIGS. 7A and 7B. In order to form multiple IO channels, the first dies 710 of different pairs in the die stack are aligned vertically, and the second dies 720 of different pairs in the die stack are aligned vertically, but the first die 710 is offset with respect to the second die 720 in the same pair in a first direction (for example X direction shown in FIGS. 7A and 7B) on the sidewall 750. In this case, the IO electrical contacts 717 of the first dies 710 are aligned in a second direction substantially perpendicular to the first direction (for example Z direction shown in FIGS. 7A and 7B) on the sidewall 750, and the IO electrical contacts 727 of the second dies 720 are aligned in the second direction (Z direction) on the sidewall 750, whereas the IO electrical contacts 717 and the IO electrical contacts 727 are spaced apart from each other along the first direction on the sidewall 750 of the semiconductor device 700. The semiconductor device 700 further includes first IO routing traces 718 connecting IO electrical contacts 717 of the first dies 710 and extending across the sidewall 750 of the die stack so as to form the first IO channels, and second IO routing traces 728 connecting IO electrical contacts 727 of the second dies 720 and extending to across the sidewall 750 of the die stack so as to form the second IO channels.

In the present embodiment, all dies in the die stack face the same direction and can have a single type of configuration for the IO conductive pattern, and multiple IO channels are separated from each other by offsetting dies connected to different IO channel. In this case, the dies in the semiconductor device can be singularized from a single wafer or wafers containing a single type of dies. This could improve yield and save production cost. In addition, in order to form more IO channels, the dies are stacked with more increments of offsets separating different IO channels. In the present embodiment, the dies in the stack are staggered, occupying a larger footprint on a substrate or a host device than the previous embodiments.

Figure 8:
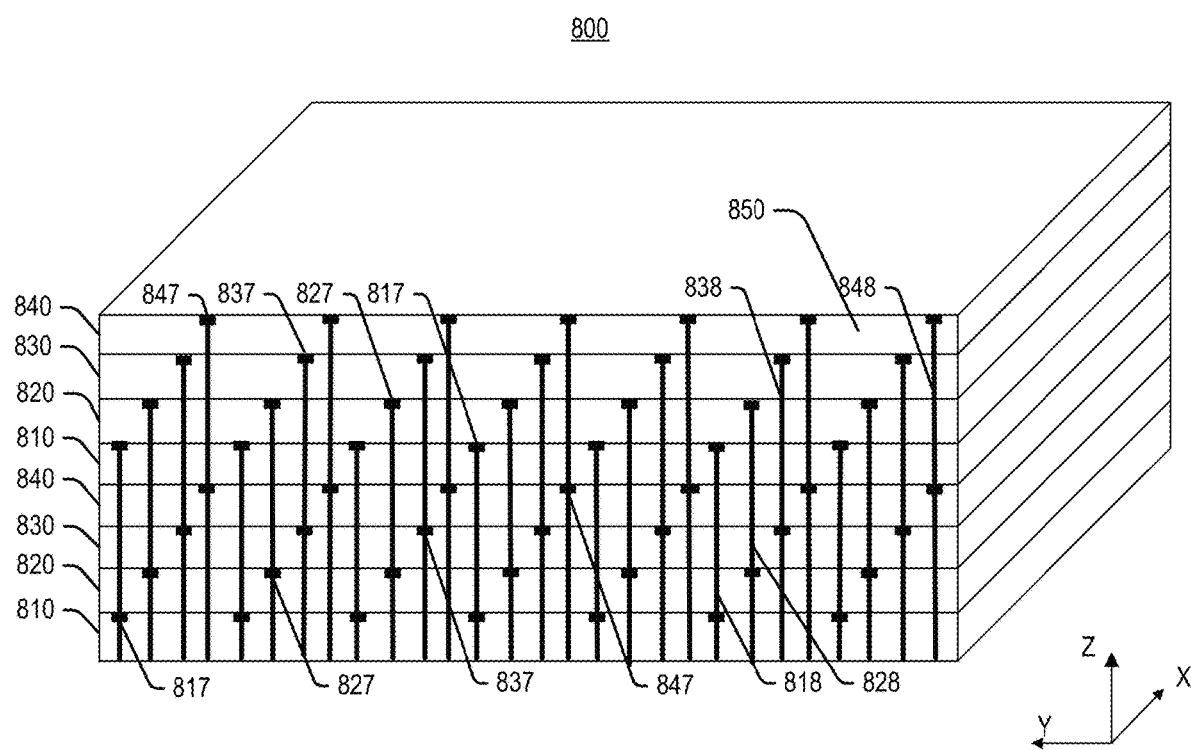
FIG. 8 is a schematic perspective view of a semiconductor device according to a further embodiment of the present technology.

FIG. 8 is a schematic perspective view of a semiconductor device 800 according to a further embodiment of the present technology. The semiconductor device 800 also includes eight dies 810 to 840 with their active surfaces facing the same direction. All dies 810 to 840 are stacked vertically without the offset shown in FIG. 7, and aligned to form a common sidewall along X-Z plane shown in FIG. 8. In this case, the separation of different IO channels is implemented by varying the arrangement of the IO electrical contacts 817-847 exposed on the common sidewall in different IO channels. For example, the IO electrical contacts in the same IO channel have a same arrangement along a first direction on the sidewall 850 of the stack (for example Y direction shown in FIG. 8) so that they are aligned in a second direction substantially perpendicular to the first direction (for example Z direction shown in FIG. 8) on the sidewall 850 of the stack and connected by a routing trace extending across the common sidewall in the second direction to a terminal surface 819 of the stack. As shown in FIG. 8, four IO channels are formed in the stack of eight dies. As an example, the IO electrical contacts 817 of the two dies 810 are connected by corresponding routing traces 818 to form a single IO channel. In the present embodiment, the IO conductive pattern can includes an IO pad spaced apart from the sidewall, and an outlet trace extending from the IO pad and exposed at the sidewall. The IO conductive pattern will be described in more details in further embodiments.

In the present embodiment, the dies in the semiconductor device 800 are stacked in a vertical configuration without offsets, thus the semiconductor device 800 can have a smaller size in comparison with the semiconductor device 700 shown in FIG. 7. Since dies connected to different IO channels have different arrangements of electrical contacts on the sidewall of the die stack, it may require different die designs such as IO conductive patterns for dies in different IP channels, resulting in increasing production cost. In order to avoid such disadvantages, novel IO conductive patterns and fabricating methods of the semiconductor device 800 according to the present embodiment are described as following.

Figure 9A:
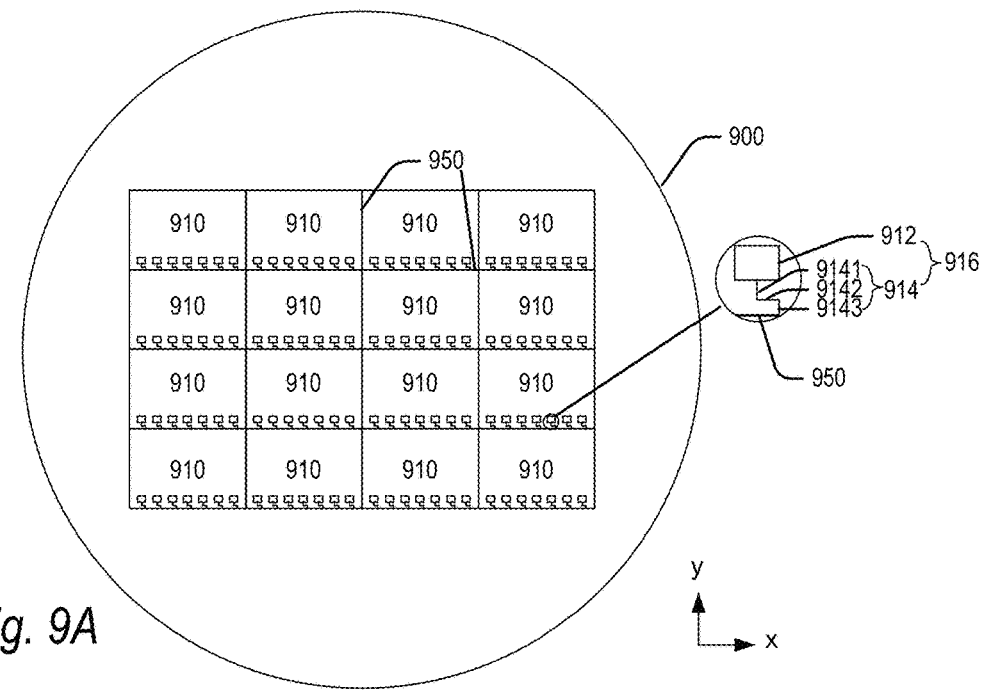
FIG. 9A to FIG. 9C are schematic views showing different stages of a fabricating method of the semiconductor device shown in FIG. 8 according to the further embodiment of the present technology.
Figure 9B:
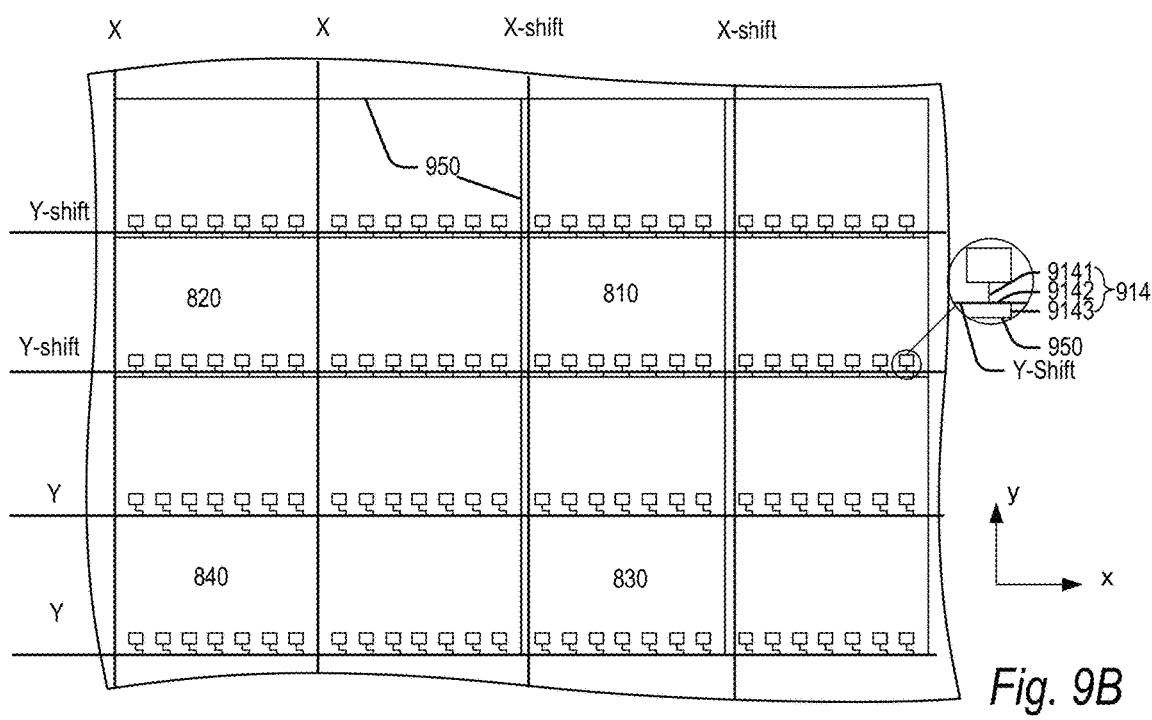
Figure 9C:
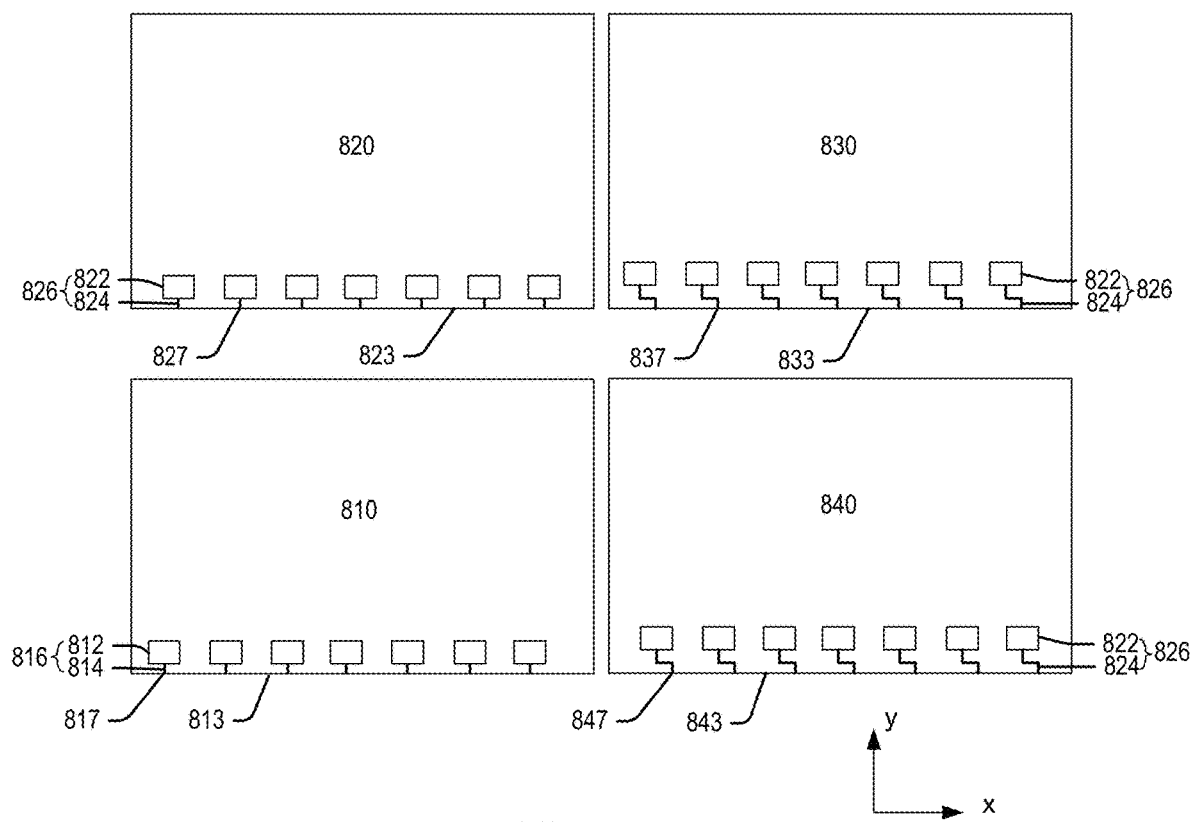

FIG. 9A to FIG. 9C are schematic views showing different steps of a fabricating method. Referring to FIG. 9A, a wafer 900 is prepared. The wafer 900 includes an array of die regions 910 (only a part of die regions are shown in FIG. 9A) delimited by scribing lines 950 extending in crossing directions on an active surface of the wafer such as X and Y directions shown in FIG. 9A. Each of die regions 900 is configured with a same IO conductive pattern, that is, an IO conductive pattern 916 on an active surface of the wafer 900. As shown in an insert of enlarged view, the IO conductive pattern 916 includes at least one IO pad 912 spaced apart from the scribing line 950, and an outlet trace 916 extending from the IO pad 912 towards the scribing line 950 and exposed at the scribing line 950. The outlet trace 914 is a stair trace including a first straight segment 9141 extending from IO pad 912 in a direction substantially perpendicular to the scribing line 950, a third straight segment 9143 extending in a direction substantially perpendicular to the scribing line 950, and spaced apart from the first straight trace 9141 in a direction parallel to the scribing line 950 and terminated at the scribing line 950 at one end, and a second segment 9142 connecting opposing ends of the first straight trace 9141 and the third straight trace 9143.

Next, as shown in FIG. 9B, the wafer 900 is cut along cutting lines labeled X and Y which are positioned at scribing lines 950, and along cutting lines labeled X-shift and Y-shift which are shifted in position in X or Y direction relative to the scribing line 950. The resulting dies 810 to 840 are shown in FIG. 9C.

In preparing the die 810, as shown in FIG. 9B, the wafer is cut along the cutting lines Y-shift extending along the second segment 9141 of the stair trace 914 and the cutting lines X-shift. Thus as shown in FIG. 9C, the resulting IO conductive pattern 816 of the die 810 include the IO pads 812 and straight traces 814 extended from the respective IO pads 812 and each having one end exposed on a side surface 813 of the die 810 to form electrical contact 817. Similarly, in preparing the die 820, the wafer is cut along cutting lines Y-shift extending through the second segment 9142 of the stair trace 914 and cutting lines X. The die 820 has a similar IO conductive pattern 826 as the IO conductive pattern 816 of the die 810. As shown in FIG. 9C, the IO conductive pattern 826 of the die 820 includes IO pads 822 and straight traces 824 extended from the respective IO pads 822 and each having an end exposed on a side surface 823 of the die 820 to form electrical contact 827. The electrical contacts 827 of the die 820 are shifted in an X direction from the electrical contacts 817 of the die 810, due to the different cuts at cutting lines X and X-shift at different positions in X direction.

In preparing the die 840, the wafer is cut along cutting lines X and Y extending along scribbling lines 950, thus the IO conductive pattern 846 of the die 840 include IO pads 842 and stair traces 846 extended from the IO pads 842 and each having one end exposed on a side surface 843 of the die 840. In preparing the die 830, the wafer is cut along cutting lines Y and X-shift. The die 830 has a similar IO conductive pattern as the die 840. The IO conductive pattern 836 of the die 830 includes IO pads 832 and stair traces 834 extended from the IO pads 832 and each having one end exposed on a side surface 827 of the die 830. The electrical contacts 837 of the die 830 are shifted in an X direction from the electrical contacts 847 of the die 840, due to the different cuts at cutting lines X and X-shift at different positions in X direction. In addition, The electrical contacts 837 and 847 of the dies 830 and 84 are also shifted in an X direction from the electrical contacts 817 and 827 of the dies 810 and 820.

In this way, the dies 810 to 840 with different arrangement of IO electrical contacts exposed on the side surface of respective die can be fabricated from a wafer with a single design of die regions, thus improving yield and saving production cost. Furthermore, the number of IO channels can be increased by increasing the number of steps of the stair trace and increasing the number of cutting lines at different positions relative to the scribing lines.

Next, the dies 810 to 840 are stacked and aligned to form the common sidewall, followed by forming IO traces on the sidewall. The details of those processes are substantially the same as those described in previous embodiments, and will not be repeated herein.

Figure 10A:
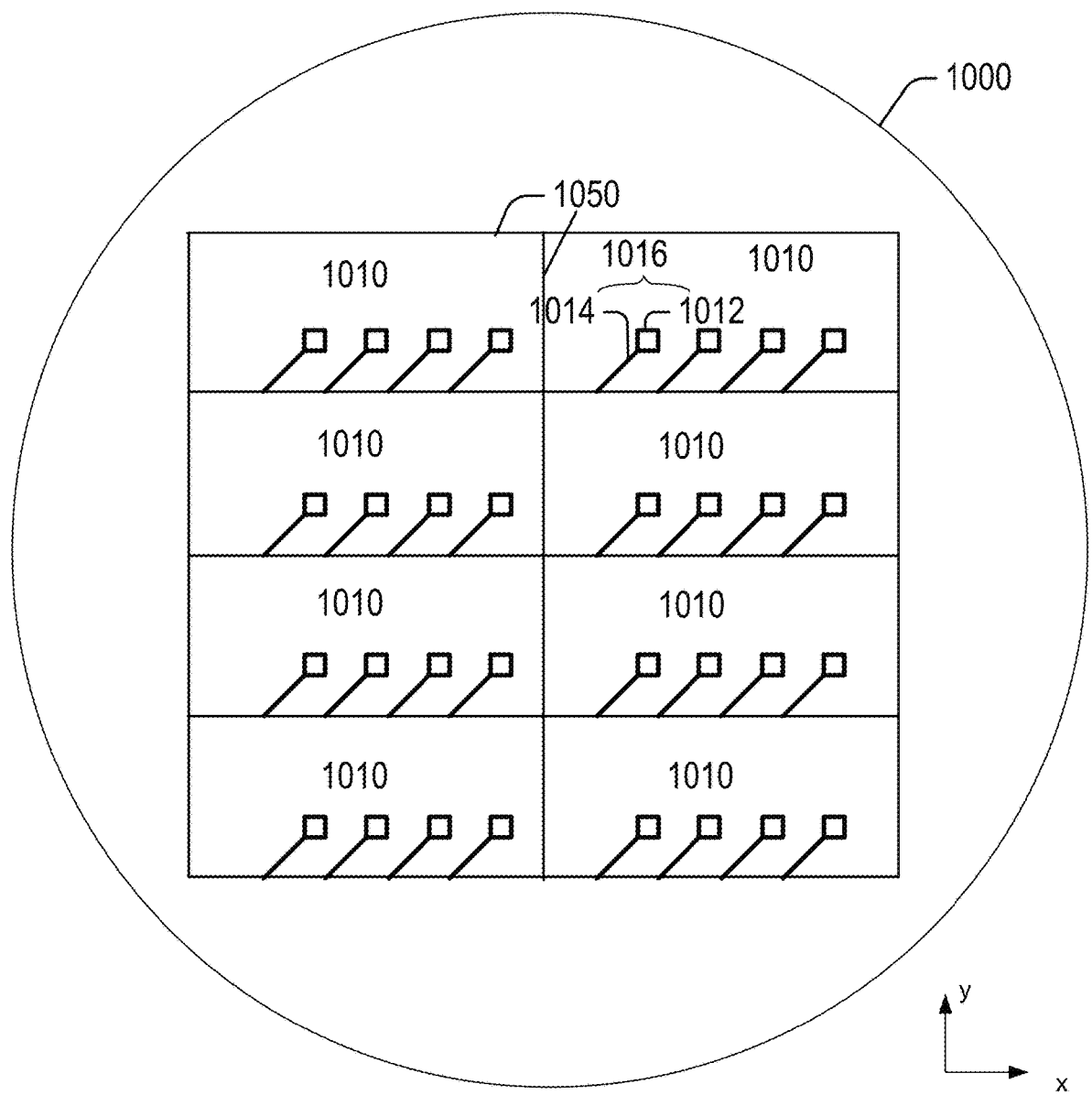
FIG. 10A to FIG. 10C are schematic views showing different stages of a second fabricating method of the semiconductor device according to the third embodiment of the present technology.

The semiconductor device 800 can also be fabricated according to a further embodiment, which is now described with reference to shown in FIG. 10A to FIG. 10C. As shown in FIG. 10A, a wafer 1000 is prepared. The wafer 1000 includes an array of die regions 1010 delimited by scribing lines 1050 extending in crossing directions such as X and Y directions on an active surface of the wafer 1000. Each of die regions 1010 includes an IO conductive pattern 1016 on the active surface of the wafer 1000. The IO conductive pattern 1016 includes IO pads 1012 spaced apart from the scribing line 1050, and an outlet traces 1014 extending from the respective IO pads 1012 terminated at the scribing line 1050 at an end. The outlet trace 1506 is a trace of a straight line shape extending in a direction inclined to the scribing line 1050.

Figure 10B:
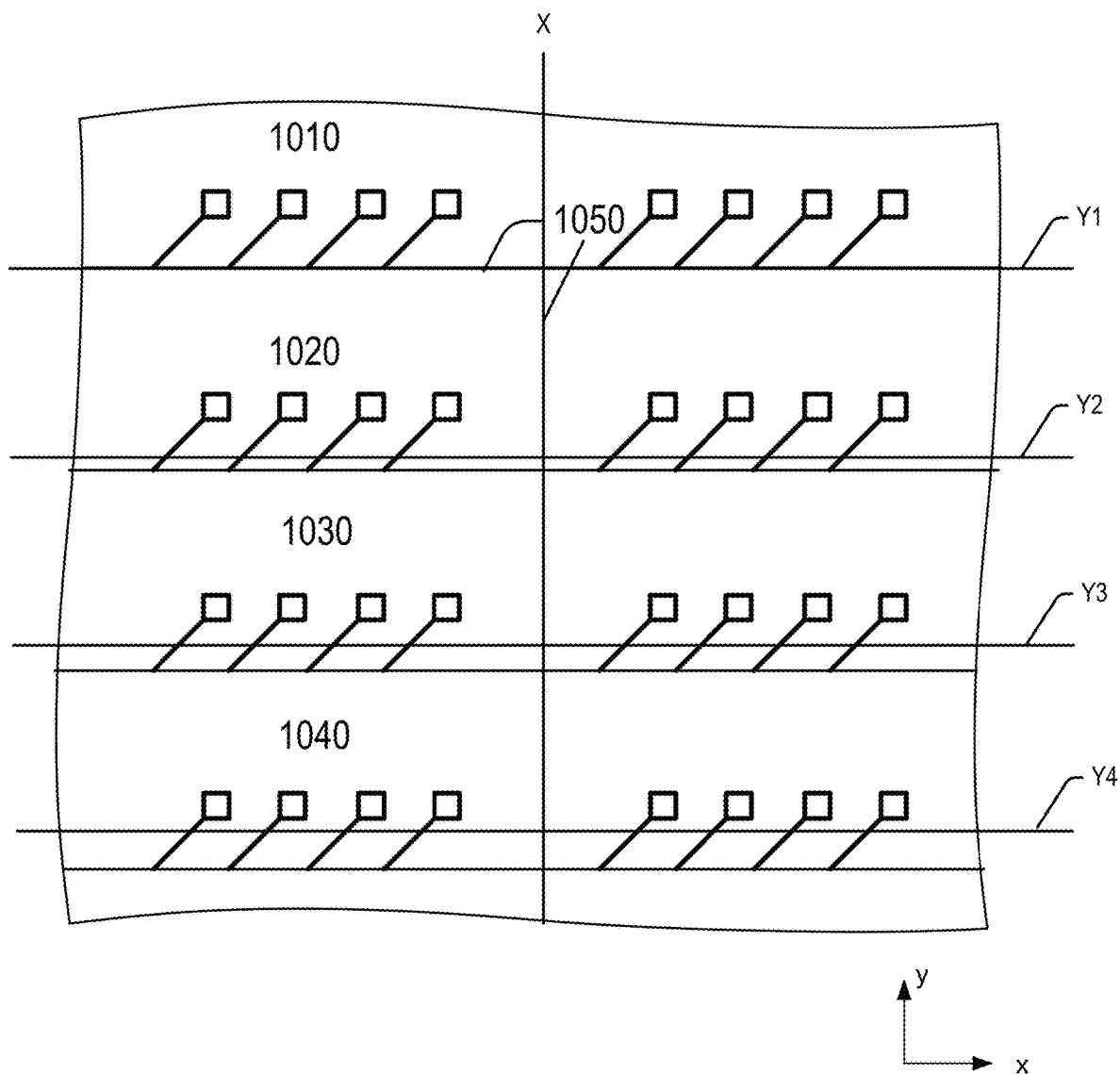
Figure 10C:
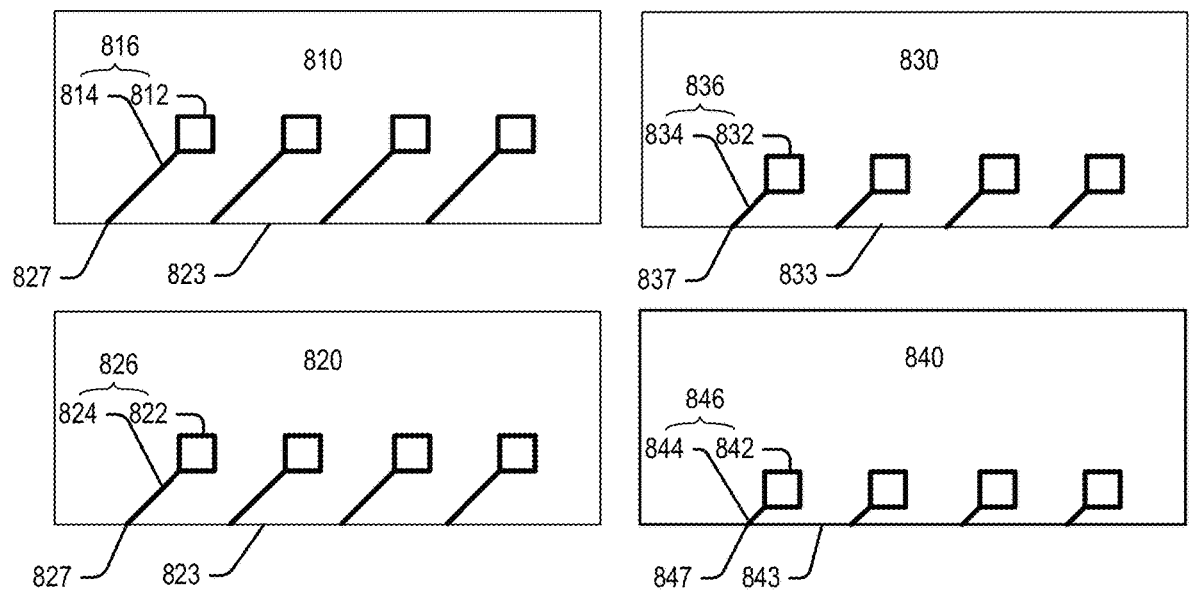

In preparing the dies 810 to 840, as shown in FIG. 10B, die regions 1010 of the wafer 1000 are cut along cutting lines labeled X along scribing lines 1050 and cutting lines Y1 to Y4 with different distances relative to the scribing line 1050 in Y direction. The resulting dies 810 to 840 are shown in FIG. 10C. Since the outlet traces 1012 of die regions 1000 are inclined to the scribbling lines 1050, the exposed ends of the respective traces 814 to 844 on the side surfaces 813 to 843 of the dies 810-840 form electrical contacts 817 to 847 at different positions due to different cutting positions along cutting lines Y1-Y4, as shown in FIG. 10B.

In this way, the dies 810 to 840 with different arrangement of IO electrical contacts exposed on the side surface of respective die can be fabricated from a wafer with a single design of die regions, thus improving yield and saving production cost. Furthermore, the number of IO channels can be increased by increasing the number of cutting lines at different positions relative to the scribing lines.

Next, the dies 810 to 840 are stacked and aligned to form the common sidewall, followed by forming IO traces on the sidewall. The details of those processes are substantially the same as those described in previous embodiments, and will not be repeated herein.

In both methods described as above, the dies with different arrangements of IO electrical contacts on the respective side surface are fabricated from a single wafer or wafers including a plurality of die regions configured with the same IO conductive pattern. Therefore, the production cost can be saved due to simple wafer design.

Figure 11:
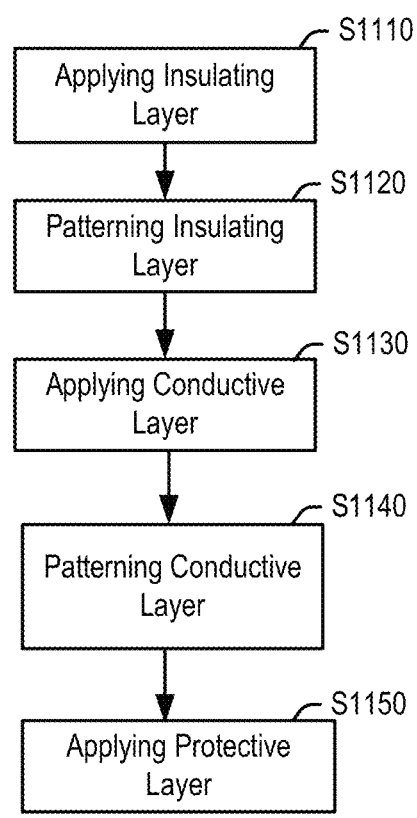
FIG. 11 is a flow chart showing a method of forming a conductive pattern on a sidewall of a die stack according to an embodiment of the present technology.
Figure 12A:
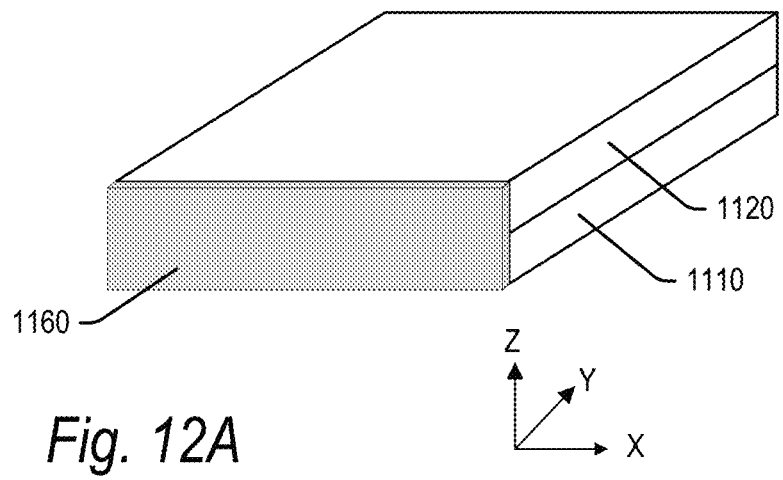
FIG. 12A to FIG. 16B are schematic views showing different stages of the method of forming a conductive pattern on a sidewall of a die stack according to an embodiment of the present technology.
Figure 12B:
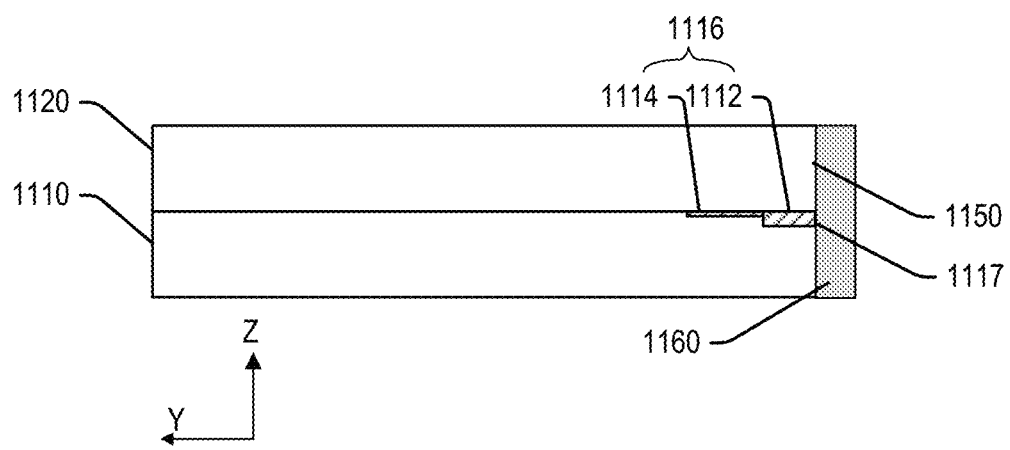

The method of forming a conductive pattern on the sidewall of a die stack will now be described in more detail by referring to a flow chart of FIG. 11 and views of FIG. 12A-16B. As shown in FIGS. 11, 12A and 12B, after aligning and stacking the dies 1110 and 1120, at a step S1110, an insulating layer 1160 is formed on the sidewall 1150 of the die stack by a known deposition process such as sputtering. The insulating layer 1160 is for example a silicon oxide or silicon nitride, or other electrical insulators. The insulating layer 1160 can have a thickness of 20 μm to 200 μm, but may be thinner or thicker than that in further embodiments.

Figure 13A:
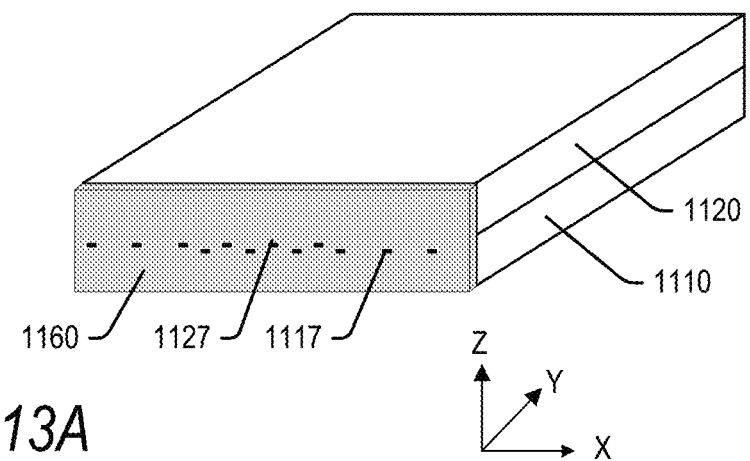
Figure 13B:
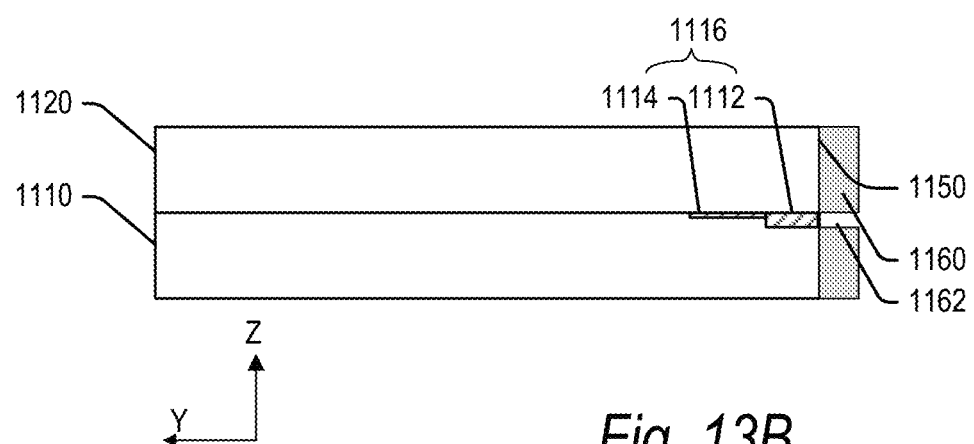

Next, at a step S1120, the insulating layer 1160 is patterned by a patterning process such as a lithography process including exposing, developing and etching steps in order to form openings 1162 penetrating the insulating layer 1160 and exposing the electrical contacts 1117 and 1127 of dies 1110 and 1120 on the sidewall 1150, as shown in FIG. 13A and FIG. 13B.

Figure 14A:
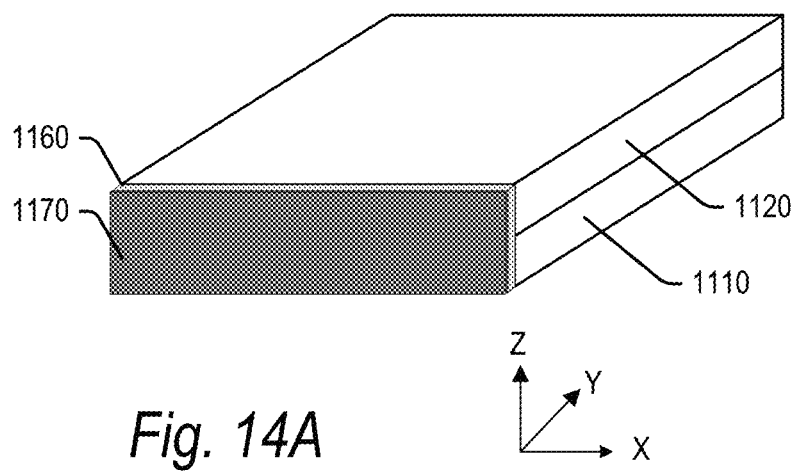
Figure 14B:
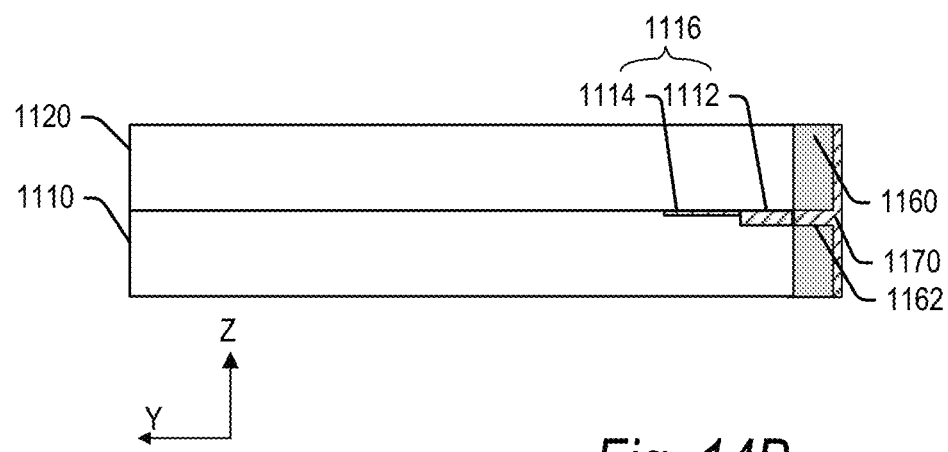

Next at a step of S1130, a conductive layer 1170 is applied over the insulating layer 1160 and into an opening 1162 by a known method such as sputtering or plating, as shown in FIG. 14A and FIG. 14B. The conductive layer 1170 is for example formed of copper, aluminum, tungsten, nickel or alloys thereof. The conductive layer 1170 may be 2-5 μm thick, but may be thicker or thinner than that in further embodiments. Annealing heating may optionally be performed to adjust a metal grain condition in the conductive layer 1170.

Figure 15A:
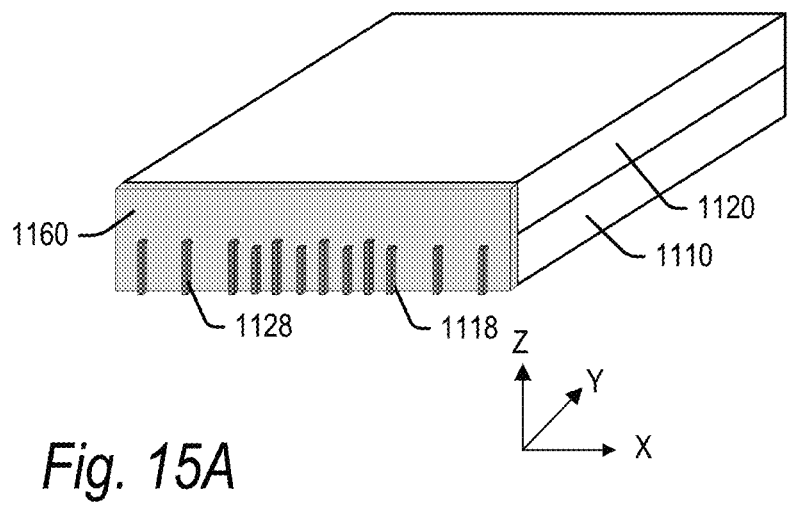
Figure 15B:
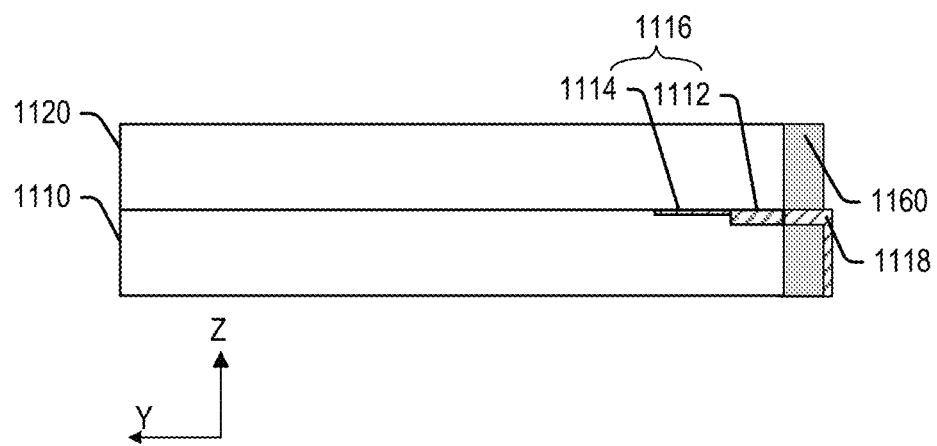

Next at a step of S1140, as shown in FIG. 15A and FIG. 15B, the conductive layer 1170 is patterned as the routing traces 1118 and 1128 by a known patterning process such as lithography process including exposing, developing and etching steps using a mask in the pattern of the final metal traces. Alternatively, the routing traces 1118 and 1128 can be formed on the insulating layer 1160 by a screen printing method. The process may additionally or alternatively employ wet or dry etching methods and chemical mechanical planarization (CMP) process.

Figure 16A:
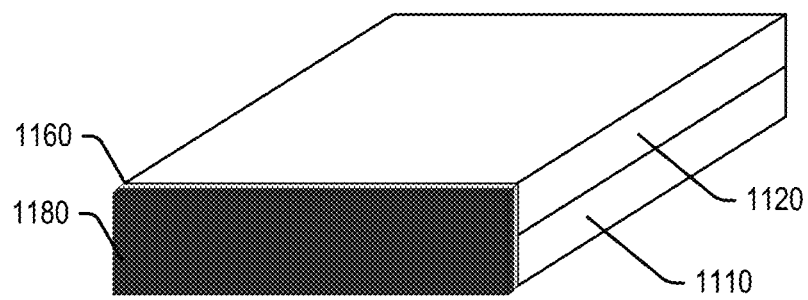
Figure 16B:
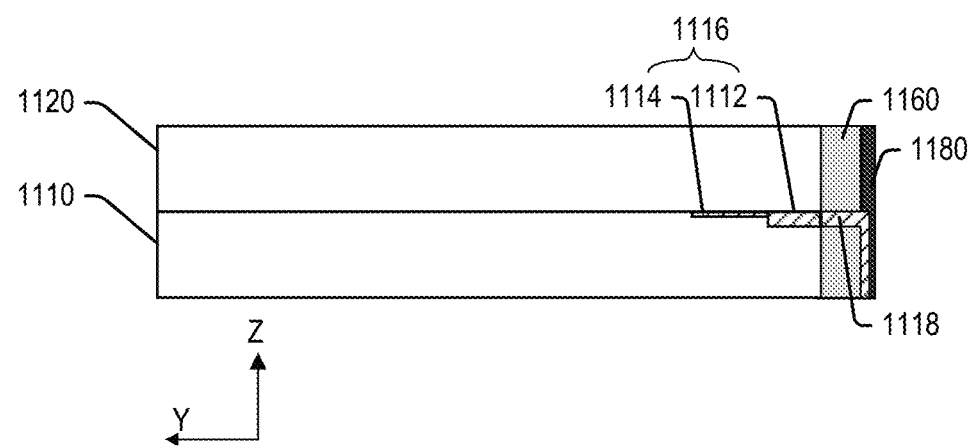

Next, as an optional step of S1150, as shown in FIG. 16A and FIG. 16B, a protective layer 1180 can be applied on the exposed surface of the routing traces 1118 and 1128 by a known deposition method such as chemical vapor deposition (CVD) or other chemical deposition processes. The protective layer 1180 can be formed of various protective and electrically insulating materials, including for example various resins including epoxies.

As another option, the insulating layer beneath the conductive pattern including the routing traces 1118 and 1128 can be removed by a selective etching process to leave a bridge conductive pattern spaced apart from the sidewall.

The semiconductor device of the present technology can be further encapsulated in a known molding process, which will not be described in detail herein.

In summary, in an aspect of the present technology, a plurality of dies stacked on top of each other, each of the dies comprising a first major surface, an IO conductive pattern on the first major surface and extended to a minor surface substantially perpendicular to the major surfaces to form at least one IO electrical contact on the minor surface, and the plurality of dies aligned so that the corresponding minor surfaces of all dies substantially coplanar with respect to each other to form a common flat sidewall, and a plurality of IO routing traces formed over the sidewall and at least partially spaced away from the sidewall. The plurality of IO routing traces are spaced apart from each other in a first direction on the sidewall, and each of IO routing traces is electrically connected to a respective IO electrical contact and extended across the sidewall in a second direction substantially perpendicular to the first direction on the sidewall.

In another aspect of the present technology, a fabricating method of a semiconductor device comprises: preparing a plurality of dies, each of the dies comprising a first major surface, an IO conductive pattern on the first major surface and extended to a minor surface to form at least one IO electrical contact on the minor surface substantially perpendicular to the major surfaces, and the plurality of dies aligned so that the corresponding minor surfaces of all dies substantially coplanar with respect to each other to form a common flat sidewall; stacking the plurality of dies on top of each other and aligned so that he corresponding minor surfaces of all dies substantially coplanar with respect to each other to form a common flat sidewall; and forming IO routing traces over the sidewall and at least partially spaced away from the sidewall, the plurality of IO routing traces are spaced apart from each other along a first direction on the sidewall, and each of IO routing traces is electrically connected to a respective IO electrical contact and extended across the sidewall in a second direction substantially perpendicular to the first direction on the sidewall.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
a plurality of dies stacked on top of each other, each of the dies comprising a first major surface, an IO conductive pattern on the first major surface and extended to a minor surface substantially perpendicular to the major surfaces to form at least one IO electrical contact on the minor surface, and the plurality of dies aligned so that the corresponding minor surfaces of all dies of the plurality of dies are substantially coplanar with respect to each other to form a common flat sidewall, and
a plurality of IO routing traces formed over the sidewall and at least partially spaced away from the sidewall,
wherein the plurality of IO routing traces are spaced apart from each other in a first direction on the sidewall, and each of IO routing traces is electrically connected to a respective IO electrical contact and extended across the sidewall in a second direction substantially perpendicular to the first direction on the sidewall;
wherein an IO routing trace of the plurality of routing traces is electrically connected to IO electrical contacts of a first die of the plurality of stacked dies and the IO routing trace is not electrically connected to any IO electrical contacts of a second die of the plurality of stacked dies; and
wherein the IO conductive pattern includes an IO pad spaced apart from the sidewall, and an outlet trace extending from the IO pad to the sidewall and exposed at the sidewall at an end, wherein the outlet trace is a stair trace comprising a first straight segment extending in a third direction perpendicular to the sidewall from the IO pad, a third straight segment extending in the third direction and exposed at the sidewall at the end, the third straight segment spaced apart from the first straight segment in the first direction of the sidewall, and a second segment connecting the first straight segment and the third straight segment.

2. The semiconductor device of claim 1, wherein:
the first die comprises a plurality of first IO electrical contacts arranged in the first direction on the sidewall and the second die comprises a plurality of second IO electrical contacts arranged in the first direction on the sidewall,
the first IO electrical contacts of the first die are connected via respective first routing traces extended across the sidewall in the second direction on the sidewall to form a first IO channel, and the second IO electrical contacts of the second die are connected via respective second routing traces extended across the sidewall in the second direction on the sidewall to form a second IO channel spaced apart from the first IO channel;
wherein the arrangement of the first IO electrical contacts on the minor surface of the first die and the arrangement of the second IO electrical contacts on the minor surface of the second die are substantially the same.

3. The semiconductor device of claim 1, wherein the IO conductive pattern includes at least one IO pad disposed on the first major surface of the die and exposed at the sidewall, and an inlet trace extended from the IO pad and away from the sidewall.

4. The semiconductor device of claim 2, wherein
the first die is connected electrically by a first routing trace to form a first IO channel, and a second die is connected electrically by a second routing trace to form a second IO channel.

5. The semiconductor device of claim 2, wherein
the IO electrical contacts of each of dies are connected to an independent IO channel.

6. The semiconductor device of claim 1, wherein
the plurality of dies are aligned to form at least two common flat sidewalls;
IO channels are distributed over the at least two common sidewalls, each of IO channel comprising IO electrical contacts exposed on the respective sidewall and routing traces formed over the respective sidewall and spaced away from the respective sidewall.

7. The semiconductor device of claim 1, further comprising an insulating layer formed on the sidewall and underneath the TO routing traces.

8. The semiconductor device of claim 1, further comprising a protective layer covering the routing traces.

9. The semiconductor device of claim 2, wherein the first TO contacts in the first die are offset from the second TO contacts in the second die across the first direction on the sidewall.

10. A semiconductor device, comprising:
a plurality of dies stacked on top of each other, each of the dies comprising a first major surface, an IO conductive pattern on the first major surface and extended to a minor surface substantially perpendicular to the major surfaces to form at least one IO electrical contact on the minor surface, and the plurality of dies aligned so that the corresponding minor surfaces of all dies of the plurality of dies are substantially coplanar with respect to each other to form a common flat sidewall, and
a plurality of IO routing traces formed over the sidewall and at least partially spaced away from the sidewall,
wherein the plurality of IO routing traces are spaced apart from each other in a first direction on the sidewall, and each of IO routing traces is electrically connected to a respective IO electrical contact and extended across the sidewall in a second direction substantially perpendicular to the first direction on the sidewall; and
wherein an IO routing trace of the plurality of routing traces is electrically connected to IO electrical contacts of a first die of the plurality of stacked dies and the IO routing trace is not electrically connected to any electrical contacts of a second die of the plurality of stacked dies;
wherein the plurality of dies including a plurality of pairs of dies, each pair of dies including a first die and a second die arranged with an offset relative to the first die in the first direction on the sidewall;
wherein the first dies in the plurality of dies are aligned so that the first IO electrical contacts in the first dies are aligned and electrically connected by first routing traces extending across the sidewall in the second direction; and
wherein the second dies in the plurality of dies are aligned so that the second IO electrical contacts in the second dies are aligned and electrically connected by second routing traces extending across the sidewall in the second direction.

11. The semiconductor device of claim 10, wherein:
the first die comprises a plurality of first IO electrical contacts arranged in the first direction on the sidewall and the second die comprises a plurality of second IO electrical contacts arranged in the first direction on the sidewall,
the first IO electrical contacts of the first die are connected via respective first routing traces extended across the sidewall in the second direction on the sidewall to form a first IO channel, and the second IO electrical contacts of the second die are connected via respective second routing traces extended across the sidewall in the second direction on the sidewall to form a second IO channel spaced apart from the first IO channel;
wherein the arrangement of the first IO electrical contacts on the minor surface of the first die and the arrangement of the second IO electrical contacts on the minor surface of the second die are substantially the same.

12. The semiconductor device of claim 11, wherein:
the first die is connected electrically by a first routing trace to form a first IO channel, and a second die is connected electrically by a second routing trace to form a second IO channel.

13. The semiconductor device of claim 11, wherein:
the IO electrical contacts of each of dies are connected to an independent IO channel.

* * * * *